(12) United States Patent
Yeap et al.

(10) Patent No.: US 6,380,041 B1
(45) Date of Patent: Apr. 30, 2002

(54) SEMICONDUCTOR WITH LATERALLY NON-UNIFORM CHANNEL DOPING PROFILE AND MANUFACTURING METHOD THEREFOR

(75) Inventors: Geoffrey Choh-Fei Yeap, Sunnyvale; Ognjen Milic, Burlingame; Che-Hoo Ng, San Martin, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/686,476

(22) Filed: Oct. 10, 2000

Related U.S. Application Data

(62) Division of application No. 09/050,747, filed on Mar. 30, 1998, now Pat. No. 6,229,177.

(51) Int. Cl.[7] .............................................. H01L 21/336
(52) U.S. Cl. ...................... 438/302; 438/305; 438/306; 438/525; 257/339
(58) Field of Search ................................. 438/199, 286, 438/302, 305, 306, 525, 527, 519, 514; 257/335, 329, 339

(56) References Cited

U.S. PATENT DOCUMENTS 5,409,848 A * 4/1995 Han et al. .................... 438/302
5,510,279 A * 4/1996 Chien et al. ................ 438/302

* cited by examiner

Primary Examiner—Charles Bowers
Assistant Examiner—Hsien-Ming Lee
(74) Attorney, Agent, or Firm—Mikio Ishimaru

(57) ABSTRACT

An ultra-large scale integrated circuit semiconductor device having a laterally non-uniform channel doping profile is manufactured by using a Group IV element implant at an implant angle of between 0° to 60° from the vertical to create interstitials in a doped silicon substrate under the gate of the semiconductor device. After creation of the interstitials, a channel doping implantation is performed using a Group III or Group V element which is also implanted at an implant angle of between 0° to 60° from the vertical. A rapid thermal anneal is then used to drive the dopant laterally into the channel of the semiconductor device by transient enhanced diffusion.

14 Claims, 3 Drawing Sheets

SEMICONDUCTOR WITH LATERALLY NON-UNIFORM CHANNEL DOPING PROFILE AND MANUFACTURING METHOD THEREFOR

CROSS-REFERENCE TO RELATED APPLICATION(S)

This is a divisional of application Ser. No. 09/050,747 filed on Mar. 30, 1998 now U.S. Pat. No. 6,229,177.

TECHNICAL FIELD

The present invention relates generally to semiconductors and more specifically to deep-submicron Metal-Oxide Semiconductors (MOS) and a manufacturing method therefor.

BACKGROUND ART

Deep-submicron Complementary Metal-Oxide-Semiconductor (CMOS) is the primary technology for ultra-large scale integrated (ULSI) circuits. Scaling of CMOS has been the principal focus of the microelectronics industry over the last two decades.

As device sizes are scaled down, the source and drain junctions have to be scaled down. As the source and drain are scaled down, series resistance increases, which degrades the device performance. To reduce series resistance, advanced MOS transistors today have relatively deep source and drain junctions to improve series resistance and very shallow source and drain extension junctions to permit the scale down.

With the very shallow source and drain extension junctions which allow the source and drain to be closer together, the channel length between the source and drain is shortened. The shortening in the channel length has lead to several severe problems.

First, with high drive currents, the leakage across the channel is unacceptably high when the transistor is supposed to be off.

Second, the transistors have low manufacturability because of a high range in off current spread between nominal and sub-nominal devices.

Third, the so-called short channel effects (SCE), which degrade the performance of the scaled MOS devices, increase disproportionately with the shortened channel. Basically, the threshold voltage for turning the transistor on and off is nonlinearly lower for sub-0.18 micron transistors than it is for a 0.18 micron transistor and even worse for a sub-0.13 transistor, making it much, much harder to control the smaller transistors.

The conventional approach has been to provide deep sub-micron transistors with laterally uniform channel doping profiles which are scaled down from larger transistors. This approach does not solve the above problems.

Although it has long been known that laterally non-uniform channel doping profiles could be the solution to these problems and although there have been a number of attempts to provide laterally non-uniform channel profiles through direct doping, all of the previous attempts have been uniformly unsuccessful in solving all the problems.

DISCLOSURE OF THE INVENTION

The present invention provides a semiconductor having a laterally non-uniform channel doping profile with a peak beneath a corner of the gate.

The present invention provides a semiconductor having a laterally non-uniform channel doping profile by using a Group IV element implant to create interstitials under at least one bottom corner of the gate and channel doping followed by a rapid thermal anneal to drive the channel dopant into the channel making use of increased effects of transient enhanced diffusion (TED).

The present invention further provides a method of manufacturing a semiconductor having a laterally non-uniform channel doping profile by using angled implants to create interstitials under the gate and implant dopants under the gate followed by a rapid thermal anneal to drive in the channel doping.

An advantage of the present invention is that it stops current leakage across the channel when the transistor is off.

Another advantage of the present invention is to make a high-manufacturability transistor with a low off current spread between nominal and sub-nominal devices.

A further advantage of the present invention is to make a transistor where the turn on and turn off voltages are linear with shortening channel length, i.e., so there is a minimum amount of threshold voltage roll-off.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
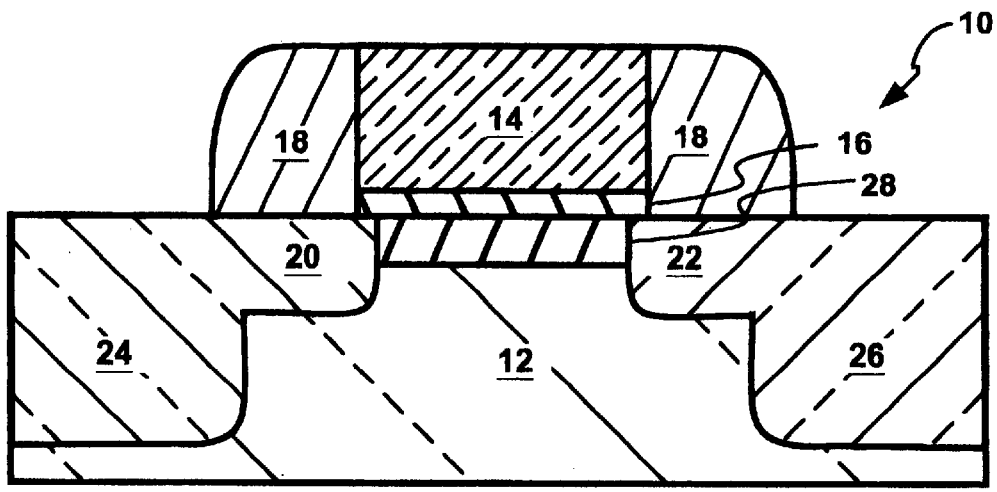
FIG. 1 is a cross-section of a semiconductor transistor gate area.

Referring now to FIG. 1, therein is shown a cross-section of a semiconductor transistor 10 showing a doped silicon substrate 12 with a polysilicon gate 14 and a gate oxide 16 disposed between the silicon substrate 12 and the gate 14. The doped silicon substrate 12 is P silicon for P-channel Metal-Oxide-Semiconductor (PMOS) transistors and N silicon for N-channel Metal-Oxide-Semiconductor (NMOS) transistors.

The oxide or nitride spacer 18 is in place which to allow the regions of various dopants to be implanted, forming doped regions of a source and a drain extension junction 20 and 22, and a source and a drain junction 24 and 26. It should be noted that the term "regions" is used since there is a tapering decrease or increase of atoms of a given dopant in the regions designated rather than a sharp demarcation as apparently indicated by the lines shown. Further, it should be noted that "source" and "drain" may be used interchangeably since they are the same for all purposes until connected in a circuit.

Between the source extension junction 20 and the drain extension junction 22 is a doped region of a channel 28 which is shorter lengthwise than the length of the polysilicon gate 14.

For PMOS, channel dopants are Group V elements such as phosphorus, arsenic, and antimony with phosphorous and arsenic being the most commonly used. For junction and extension junction dopants, Group III elements such as boron, aluminum, and gallium are used, with boron (B) or boron difluoride ($BF_2$) being the most commonly used.

For NMOS, Group III elements are used as channel dopants and Group V elements are used as junction and extension junction dopants.

Figures 2A, 2B:
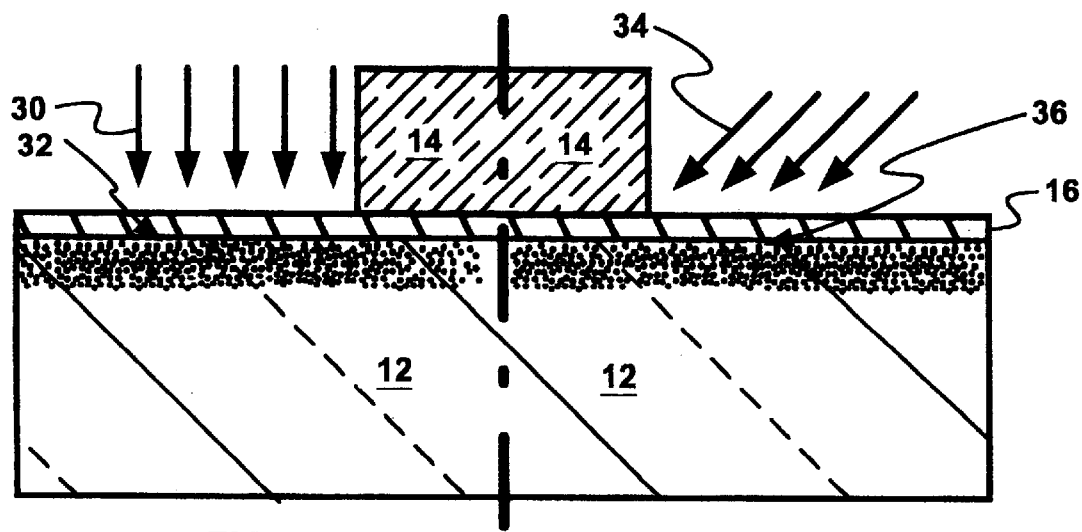
FIG. 2A is the low angle implantation of interstitials into the silicon substrate.
FIG. 2B is the high angle implantation of interstitials into the silicon substrate.

Referring now to FIG. 2A, therein is shown the silicon substrate 12 after the conventional step of polysilicon gate etch which forms the polysilicon gate 14 and polysilicon reoxidation which forms the gate oxide 16. The arrows 30 show the implantation of defects or interstitials 32 by ion implantation where the angle of implantation is low with the limit being 0° from the vertical. The interstitials are created with Group IV elements such as silicon and germanium. It should be noted that the FIGS. are divided into A and B figures to show the two ranges of processing. They also represent the capability of the method of the present invention to be asymmetrical, as shown, or bi-symmetrical with respect to the polysilicon gate 14.

Referring now to FIG. 2B, therein is shown the silicon substrate 12 after the conventional step of polysilicon gate etch which forms the polysilicon gate 14 and polysilicon reoxidation which forms the gate oxide 16. The arrows 34 show the high tilt angle implantation of interstitials 36 by ion implantation where the angle of implantation is as large as possible with the implantation equipment, which is currently about 60° from the vertical. It will be noted that the interstitials 36 extend further and in higher concentration under the polysilicon gate 14 than the interstitials 32 in FIG. 2A. As would be obvious to those skilled in the art, implantation can be done throughout the range of 0° from the vertical to past 60° from the vertical with higher angles being able to implant directly further distances under the edge of the polysilicon gate 14.

Figures 3A, 3B:
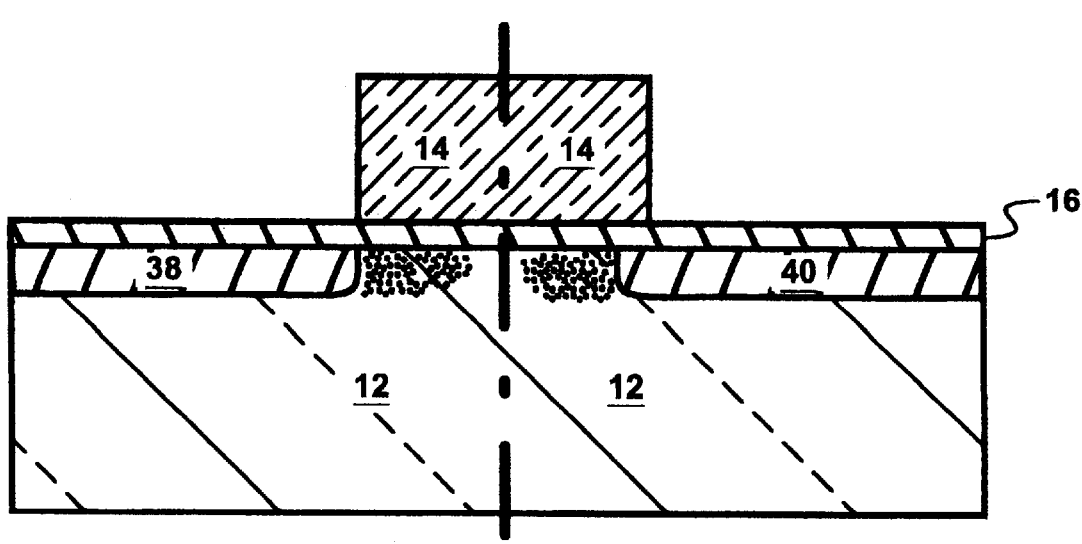
FIG. 3A is the low angle implantation of dopant into the silicon substrate
FIG. 3B is the high angle implantation of dopants into the silicon substrate.

Referring now to FIG. 3A, therein is shown a channel dopant 38 having been implanted by ion implantation with a low implant angle. As with conventional semiconductor transistors, the channel dopant is one of the Group V elements for PMOS transistors and Group III elements for NMOS transistors.

Referring now to FIG. 3B, therein is shown a channel dopant 40 having been implanted by ion implantation with as high an implant angle as possible from the vertical. It will be noted that the channel dopant 40 extends further under the polysilicon gate 14 than the channel dopant 38 in FIG. 3A.

Figures 4A, 4B:
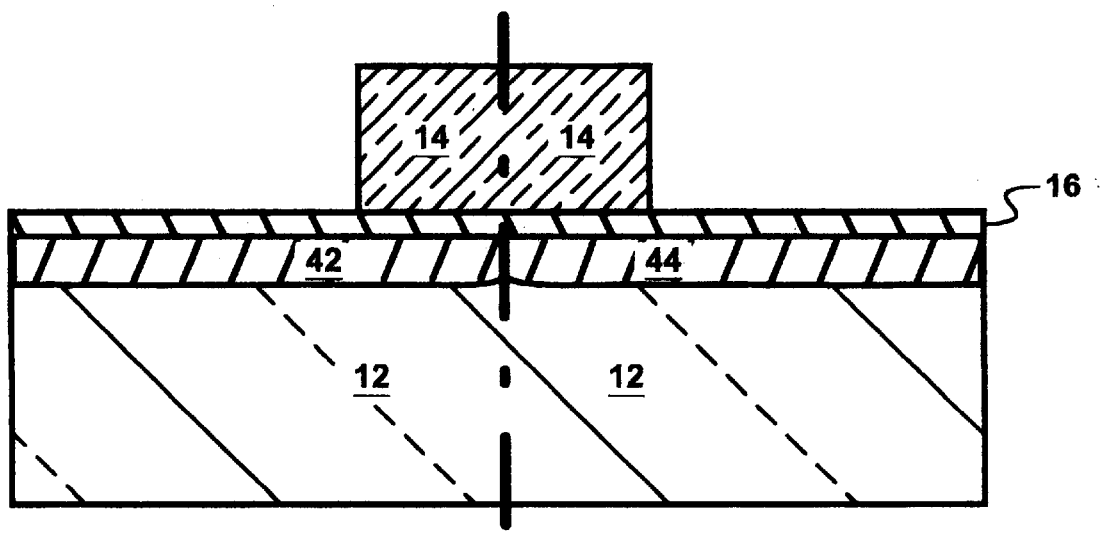
FIG. 4A is the dopant of FIG. 3A after rapid thermal anneal.
FIG. 4B is the dopant of FIG. 3B after rapid thermal anneal.

Referring now to FIG. 4A, therein is shown the channel dopant 42 after rapid thermal anneal which drives the channel dopant 38, shown in FIG. 3A, laterally into the interstitials 32 in the channel 28.

Referring now to FIG. 4B, therein is shown the channel dopant 44 after rapid thermal anneal which drives the channel dopant 40, shown in FIG. 3B, laterally into the interstitials 36 in the channel 28. It will be noted that the channel dopant 40 is driven under the polysilicon gate 14 substantially to the same extent as the channel dopant 42; the major difference will be in the doping profile in the channel 28.

Figure 5:
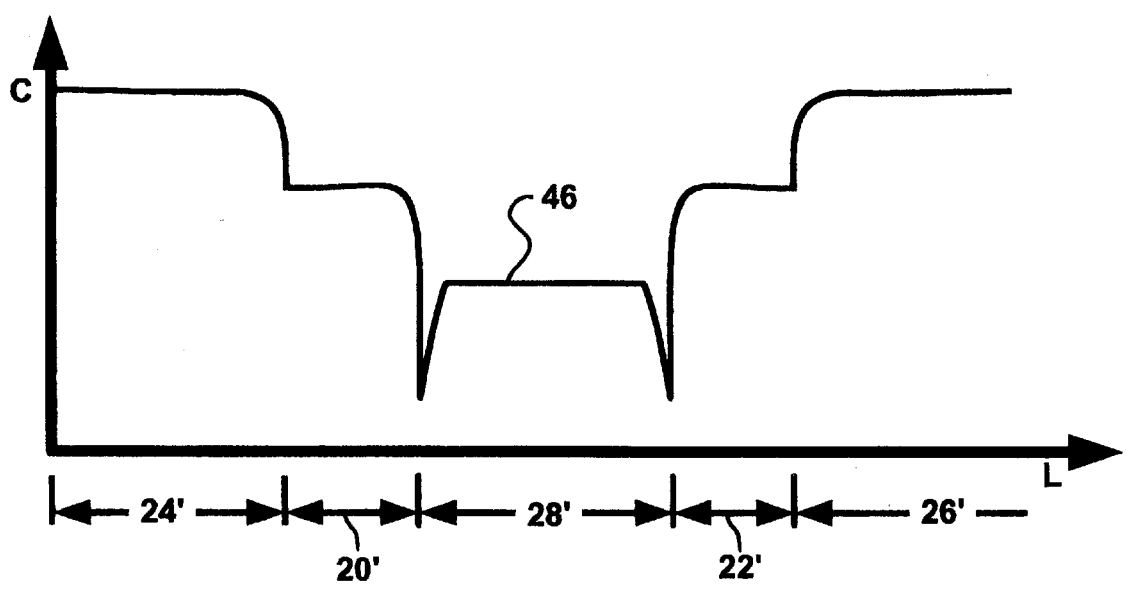
FIG. 5 (PRIOR ART) is a graph of doping concentration versus channel length for the prior art.

Referring now to FIG. 5 (PRIOR ART), therein is shown a graph of the length (L) of the semiconductor transistor 10 of FIG. 1 versus the doping concentration (C). The length designated 24' indicates the doping concentration in the source junction 24, length 20' in the source extension junction 20, the length 28' in the channel 28, the length 22' in the drain extension junction 22, and the length 26' in the drain junction 26. The length 28' is slightly shorter than the length of the polysilicon gate 14 such that reduced concentration of dopants at the meeting points of lengths 20' and 28' and of lengths 28' and 22' are under the edges of the polysilicon gate 14.

In FIG. 5 (PRIOR ART), the line 46 represents the concentration of dopant in the channel 28 in the prior art. As can be seen, the doping concentration of the channel dopant is low just where the source extension junction 20 is at its lowest concentration. The channel dopant increases and is almost constant for the length of the channel 28 and reaches a low where the drain extension junction 22 is at its lowest.

Figure 6:
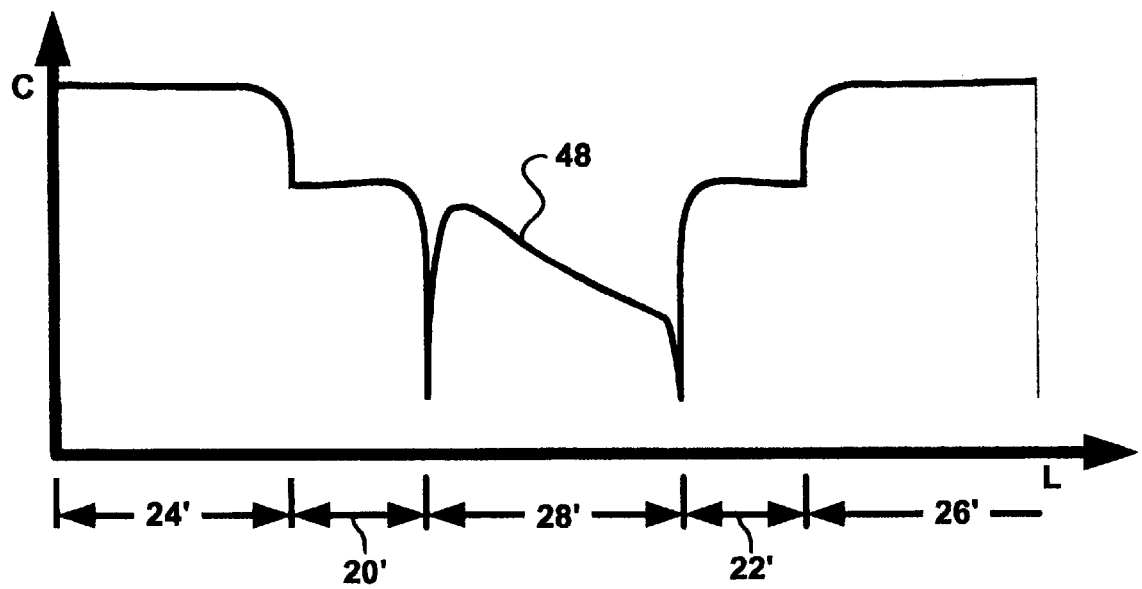
FIG. 6 is a graph of doping concentration versus channel length for the low angle implantation of interstitials and dopant.

Referring now to FIG. 6, therein is shown the graph of the length (L) of the semiconductor transistor 10 versus the doping concentration (C) similar to the graph in FIG. 5 (PRIOR ART). In FIG. 6, the line 48 represents the concentration of dopant in the channel 28 when the low angle implantation processes of FIGS. 2A, 3A, and 4A are used. This line 48 shows a peaking concentration of dopant just under one edge of the polysilicon gate 14.

Figure 7:
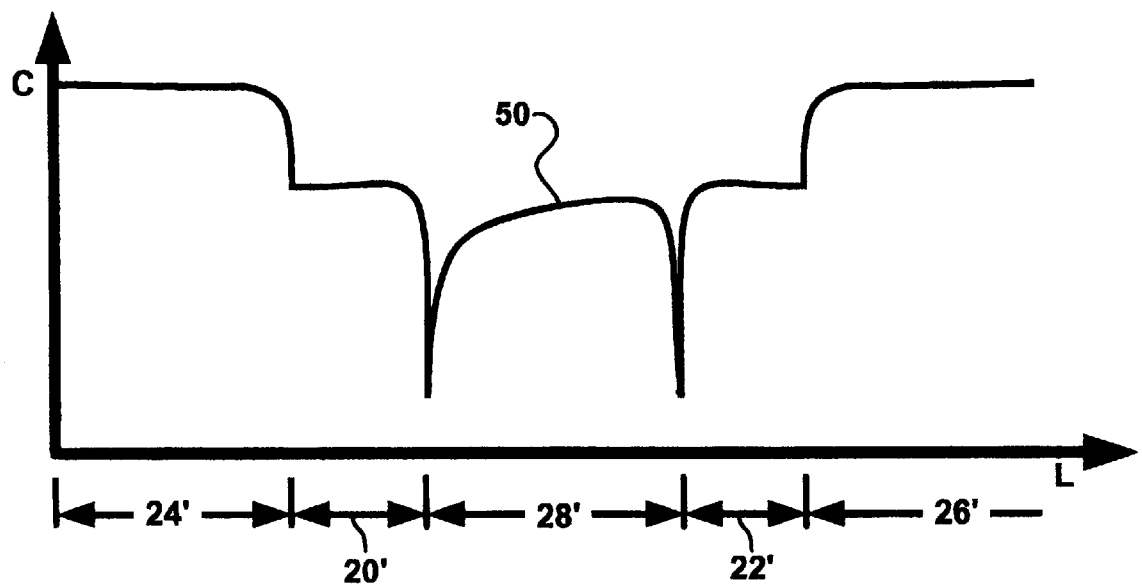
FIG. 7 is a graph of doping concentration versus channel length for the high angle implantation of interstitials and dopant.

Referring now to FIG. 7, therein is shown the graph of the length (L) of the semiconductor transistor 10 versus the doping concentration (C) similar to the graph in FIG. 5 (PRIOR ART). In FIG. 7, the line 50 represents the concentration of dopant in the channel 28 when the high angle implantation processes of FIGS. 2B, 3B, and 4B are used. This line 50 shows a peaking concentration of dopant just under one edge of the polysilicon gate 14 but with a greater overall doping concentration under the length of the polysilicon gate 14.

The method of making the semiconductor transistor 10 according to the present invention starts after the conventional step of polysilicon gate etch which forms the polysilicon gate 14 and polysilicon reoxidation which forms the gate oxide 16. One of the Group IV elements is implanted in the doped silicon substrate 14 to create defects. The implantation is generally done by ion implantation with the angle of implantation as high as possible but generally in the range of 0° to 60° from the vertical.

The next step is another implantation step of the channel dopant which is an element from the Group V elements for a PMOS transistor and which is an element from the Group III elements for NMOS. Again, the implantation is generally done by ion implantation with the angle of implantation as high as possible but generally in the range of 0° to 60° from the vertical. It will be noted that there is nothing to prevent a low angle interstitial implantation and a high angle channel dopant implantation or vice versa.

After the channel dopant implantation, the next step is a rapid thermal anneal (RTA) which in the best mode is carried out between 900° C. to 1050° C. for 10 seconds. This RTA causes transient enhanced diffusion (TED) which can cause diffusion laterally into the interstitials thousands of times faster than vertical diffusion into the relatively defect free silicon substrate 12 into which the interstitial implantation has not reached.

After the RTA, the semiconductor is ready for further conventional processing. The silicon substrate 12 is ready to have the source and drain extension junctions formed by further implantation of Group III elements for PMOS transistors and Group V elements for NMOS. Then, the spacer 18 is deposited to shield the source and drain extension junctions. Finally, the source and drain junctions formed by still further implantation of Group III elements for PMOS transistors and Group V elements for NMOS.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for manufacturing a semiconductor with a channel having a laterally non-uniform channel doping profile, comprising the steps of:
   providing a semiconductor substrate having a polysilicon gate and a gate oxide formed thereon;
   implanting interstitials in the semiconductor substrate proximate a single edge of the polysilicon gate;
   implanting a dopant into said interstitials; and
   rapid thermal annealing said semiconductor substrate to drive said dopant by transient enhanced diffusion laterally into said channel.

2. The method as claimed in claim 1 wherein the step of implanting said interstitials is done at an implanting angle in the range of 0° to 60° from the vertical.

3. The method as claimed in claim 1 wherein the step of implanting said channel dopant is done at an implanting angle in the range of 0° to 60° from the vertical.

4. The method as claimed in claim 1 wherein the step rapid thermal annealing is carried out between 900° C. to 1050° C.

5. The method as claimed in claim 1 wherein the step rapid thermal annealing is carried out between 900° C. to 1050° C. for about 10 seconds.

6. The method as claimed in claim 1 wherein the step of implanting dopants uses a Group V element.

7. The method as claimed in claim 1 wherein the step of implanting dopants uses a Group III element.

8. A method for manufacturing a semiconductor with a channel having a laterally non-uniform channel doping profile, comprising the steps of:
   providing a semiconductor substrate having a polysilicon gate and a gate oxide formed thereon;
   implanting interstitials using a Group IV element in the semiconductor substrate proximate a single edge of the polysilicon gate;
   implanting a dopant into said interstitials; and
   rapid thermal annealing said semiconductor substrate to drive said dopant by transient enhanced diffusion laterally into said channel.

9. The method as claimed in claim 8 wherein the step of implanting said interstitials is done at an implanting angle in the range of 0° to 60° from the vertical.

10. The method as claimed in claim 8 wherein the step of implanting said channel dopant is done at an implanting angle in the range of 0° to 60° from the vertical.

11. The method as claimed in claim 8 wherein the step rapid thermal annealing is carried out between 900° C. to 1050° C.

12. The method as claimed in claim 8 wherein the step rapid thermal annealing is carried out between 900° C. to 1050° C. for about 10 seconds.

13. The method as claimed in claim 8 wherein the step of implanting dopants uses a Group V element.

14. The method as claimed in claim 8 wherein the step of implanting dopants uses a Group III element.

* * * * *

UNITED STATES PATENT AND TRADEMARK OFFICE
CERTIFICATE OF CORRECTION

PATENT NO. : 6,380,041 B1
DATED : April 30, 2002
INVENTOR(S) : Yeap et al.

It is certified that error appears in the above-identified patent and that said Letters Patent is hereby corrected as shown below:

<u>Column 1,</u>
Line 64, delete "comer" and insert therefor -- corner --

Signed and Sealed this

Second Day of July, 2002

Attest:

Attesting Officer

JAMES E. ROGAN
*Director of the United States Patent and Trademark Office*